United States Patent
Kobayakawa

(10) Patent No.: US 9,659,913 B2
(45) Date of Patent: May 23, 2017

(54) LED MODULE AND LED MODULE PACKAGING STRUCTURE

(71) Applicant: ROHM CO., LTD., Kyoto (JP)

(72) Inventor: Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/719,783

(22) Filed: May 22, 2015

(65) Prior Publication Data

US 2015/0348949 A1    Dec. 3, 2015

(30) Foreign Application Priority Data

May 27, 2014  (JP) ................... 2014-109044

(51) Int. Cl.
| | |
|---|---|
| *H01L 33/00* | (2010.01) |
| *H01L 25/075* | (2006.01) |
| *H01L 33/62* | (2010.01) |
| *H01L 33/48* | (2010.01) |

(52) U.S. Cl.
CPC ........ *H01L 25/0753* (2013.01); *H01L 33/486* (2013.01); *H01L 33/62* (2013.01); *H01L 2224/48227* (2013.01); *H01L 2924/181* (2013.01)

(58) Field of Classification Search
CPC ....................................... H01L 33/62
USPC ..................................... 257/88, 99
See application file for complete search history.

(56) References Cited

U.S. PATENT DOCUMENTS

| | | | |
|---|---|---|---|
| 2011/0198653 A1* | 8/2011 | Cho ............... | H01L 33/486 257/98 |
| 2012/0228650 A1* | 9/2012 | Chern ............. | H01L 24/97 257/88 |
| 2013/0020595 A1* | 1/2013 | Moriguchi ....... | H01L 24/97 257/89 |
| 2013/0293810 A1* | 11/2013 | Ke ................. | F21V 9/10 349/65 |
| 2014/0284629 A1* | 9/2014 | Takai .............. | G02B 6/4259 257/82 |
| 2016/0163765 A1* | 6/2016 | Hu ................. | H01L 27/156 257/93 |

FOREIGN PATENT DOCUMENTS

JP    2012-169326    9/2012

* cited by examiner

*Primary Examiner* — Igwe U Anya
(74) *Attorney, Agent, or Firm* — Hamre, Schumann, Mueller & Larson, P.C.

(57) ABSTRACT

An LED module includes: a substrate including main, rear, and bottom surfaces; a first light emitting element disposed on the main surface; a conductive layer formed on the substrate and electrically coupled with the first light emitting element; a first conductive bonding layer interposed between the first light emitting element and the conductive layer; a main surface insulating film formed on the main surface and covering a portion of the conductive layer; and a first wire, wherein the main surface and the rear surface face opposite directions, the bottom surface connects long sides of the main and rear surfaces, the conductive layer includes a first wire bonding portion where the first wire is bonded, and the main surface insulating film includes a first insulating portion including a portion interposed between the first light emitting element and the first wire bonding portion when viewed in a thickness direction of the substrate.

46 Claims, 12 Drawing Sheets

LED MODULE AND LED MODULE PACKAGING STRUCTURE

CROSS-REFERENCE TO RELATED APPLICATION

This application is based upon and claims the benefit of priority from Japanese Patent Application No. 2014-109044, filed on May 27, 2014, the entire contents of which are incorporated herein by reference.

TECHNICAL FIELD

The present disclosure relates to an LED module and an LED module packaging structure.

BACKGROUND

LED modules for emitting desired light have been conventionally known. As shown in FIG. 1, an LED module 900 includes a substrate 920, a wiring 930, LED chips 940, and wires 950. The wiring 930 is formed on the substrate 920. The wiring 930 includes a wire bonding pad 931 to which the wires 950 are bonded. The LED chips 940 are arranged at the wiring 930.

In such a conventional LED module 900, the LED chips 940 are arranged at the wiring 930 via, for example, a silver paste (not shown in FIG. 1). When arranging the LED chips 940, if the silver paste comes into contact with the wire bonding pad 931, a portion of the wiring 930 where the LED chips 940 are arranged and the wire bonding pad 931 are short-circuited. This makes it difficult to increase the yield.

SUMMARY

The present disclosure provides some embodiments of an LED module which is capable of increasing a yield.

According to one embodiment of the present disclosure, there is provided an LED module including: a substrate including a main surface, a rear surface, and a bottom surface; a first light emitting element disposed on the main surface; a conductive layer formed on the substrate and electrically coupled with the first light emitting element; a first conductive bonding layer interposed between the first light emitting element and the conductive layer; a main surface insulating film formed on the main surface and covering a portion of the conductive layer; and a first wire, wherein the main surface and the rear surface respectively face directions opposite to each other and have an elongated rectangular shape and the bottom surface connects a long side of the main surface with a long side of the rear surface and is a mounting surface, wherein the conductive layer includes a first wire bonding portion to which the first wire is bonded, and wherein the main surface insulating film includes a first insulating portion and the first insulating portion includes a portion interposed between the first light emitting element and the first wire bonding portion when viewed in a thickness direction of the substrate perpendicular to the main surface.

In some embodiments, the first insulating portion crosses in front of a side of the first light emitting element when viewed in the longitudinal direction of the main surface.

In some embodiments, the first insulating portion is formed to extend from one end of the main surface in the lateral direction of the main surface to the other end of the main surface in the lateral direction of the main surface.

In some embodiments, the first insulating portion is of a strip shape extending in the lateral direction of the main surface.

In some embodiments, the first insulating portion is spaced apart from the first wire bonding portion.

In some embodiments, the first wire bonding portion is spaced apart from the first light emitting element in the longitudinal direction of the main surface.

In some embodiments, the first wire is bonded to the first light emitting element.

In some embodiments, the first wire crosses the first insulating portion.

In some embodiments, the conductive layer includes a first strip portion extending in the longitudinal direction of the main surface and electrically coupled with the first wire bonding portion, and the first strip portion is spaced apart from the first light emitting element in the lateral direction of the main surface.

In some embodiments, the first strip portion is connected to the first wire bonding portion.

In some embodiments, the conductive layer includes a first main surface individual electrode to which the first light emitting element is bonded, and the first strip portion is spaced apart from the first main surface individual electrode in the lateral direction of the main surface.

In some embodiments, a distance between the first strip portion and the first main surface individual electrode is 0.04 to 0.08 mm.

In some embodiments, the main surface insulating film includes a first covering portion covering the first strip portion, and the first covering portion extends to a side of the first strip portion at which the first light emitting element is positioned.

In some embodiments, the first covering portion has a strip shape extending in the longitudinal direction of the main surface.

In some embodiments, the first covering portion is wider than the first strip portion.

In some embodiments, the first covering portion is connected to the first insulating portion.

In some embodiments, the conductive layer includes a first main surface individual electrode to which the first light emitting element is bonded, the first covering portion is spaced apart from the first main surface individual electrode in the lateral direction of the main surface, and a distance between the first covering portion and the first main surface individual electrode is 0.02 to 0.06 mm.

In some embodiments, the LED module further includes a second wire, wherein the conductive layer includes a second wire bonding portion to which the second wire is bonded, wherein the main surface insulating film includes a second insulating portion and the second insulating portion includes a portion interposed between the first light emitting element and the second wire bonding portion when viewed in the thickness direction of the substrate, and wherein the first light emitting element is interposed between the second insulating portion and the first insulating portion.

In some embodiments, the second insulating portion crosses in front of a side of the first light emitting element when viewed in the longitudinal direction of the main surface.

In some embodiments, the second insulating portion is formed to extend from one end of the main surface in the lateral direction of the main surface to the other end of the main surface in the lateral direction of the main surface.

In some embodiments, the second insulating portion is of a strip shape extending in the lateral direction of the main surface.

In some embodiments, the second insulating portion is spaced apart from the second wire bonding portion.

In some embodiments, the second wire bonding portion is spaced apart from the first light emitting element in the longitudinal direction of the main surface.

In some embodiments, the second wire bonding portion is electrically coupled with the first wire bonding portion.

In some embodiments, the second wire bonding portion is connected to the first strip portion.

In some embodiments, the second insulating portion is connected to the first covering portion.

In some embodiments, at least three sides of the first light emitting element are surrounded by the first insulating portion, the second insulating portion and the first covering portion of the main surface insulating film.

In some embodiments, the conductive layer includes a first main surface individual electrode to which the first light emitting element is bonded, the conductive layer includes a first through wiring penetrating through the substrate, the first main surface individual electrode includes a first die bonding portion to which the first light emitting element is bonded, and a first adjacent portion connected to the first die bonding portion and is adjacent to the first die bonding portion, and the first adjacent portion overlaps with the first through wiring when viewed in the thickness direction.

In some embodiments, the second insulating portion overlaps with the first adjacent portion when viewed in the thickness direction.

In some embodiments, the LED module further includes: a second light emitting element disposed on the main surface; and a second conductive bonding layer interposed between the second light emitting element and the conductive layer, wherein the first light emitting element and the second light emitting element are spaced apart from each other in the longitudinal direction of the main surface, and wherein the second wire bonding portion is interposed between the first light emitting element and the second light emitting element when viewed in the lateral direction of the main surface.

In some embodiments, the second wire is bonded to the second light emitting element.

In some embodiments, the conductive layer includes a main surface edge individual electrode to which the second light emitting element is bonded, and a distance between the main surface edge individual electrode and the second wire bonding portion is 0.07 to 0.13 mm.

In some embodiments, the LED module further includes: a third light emitting element disposed on the main surface; and a third conductive bonding layer interposed between the third light emitting element and the conductive layer, wherein the first light emitting element is interposed between the second light emitting element and the third light emitting element when viewed in the lateral direction of the main surface, and wherein the main surface insulating film includes a third insulating portion and the third insulating portion has a portion interposed between the third light emitting element and the first wire bonding portion when viewed in the thickness direction of the substrate.

In some embodiments, the conductive layer includes a second main surface individual electrode to which the third light emitting element is bonded, and the third insulating portion covers a portion of the second main surface individual electrode.

In some embodiments, the conductive layer includes a second through wiring penetrating through the substrate, the second main surface individual electrode includes a second die bonding portion to which the third light emitting element is bonded, and a second adjacent portion which is connected to the second die bonding portion and is adjacent to the second die bonding portion, and the second adjacent portion overlaps with the second through wiring when viewed in the thickness direction.

In some embodiments, the third insulating portion overlaps with the second adjacent portion when viewed in the thickness direction.

In some embodiments, the conductive layer includes a second strip portion electrically coupled with the first wire bonding portion and extends in the lateral direction of the main surface, and the second strip portion is spaced apart from the third light emitting element in the lateral direction of the main surface.

In some embodiments, the second strip portion is connected to the first wire bonding portion.

In some embodiments, the main surface insulating film includes a second covering portion covering the second strip portion, and the second covering portion extends to a side of the second strip portion at which the third light emitting element is positioned.

In some embodiments, the second covering portion is of a strip shape extending in the longitudinal direction of the main surface.

In some embodiments, the second covering portion is wider than the second strip portion.

In some embodiments, the second covering portion is connected to the third insulating portion.

In some embodiments, the substrate has a side surface connecting the main surface and the rear surface. Further, the substrate is formed with a corner groove, the corner groove recessed from the side surface and the bottom surface and extending to the main surface and the rear surface in the thickness direction of the substrate, and the conductive layer includes a corner groove wiring formed in the inner surface of the corner groove.

In some embodiments, the corner groove has a quadrant-shaped cross section.

In some embodiments, the conductive layer further includes a rear surface electrode formed on the rear surface.

In some embodiments, the LED module further includes a transparent resin covering the first light emitting element.

According to another embodiment of the present disclosure, there is provided an LED module packaging structure including: the above-described LED module; and a circuit board facing the bottom surface.

The above and other features and advantages of the present disclosure will be more apparent from the following detailed description in conjunction with the accompanying drawings.

DETAILED DESCRIPTION

Figure 1:
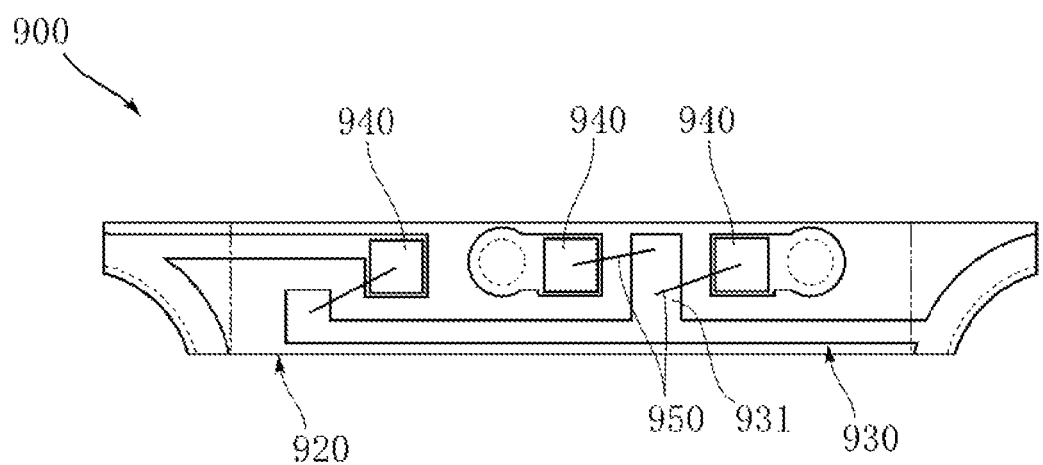
FIG. 1 is a plan view of a conventional LED module.

Embodiments of the present disclosure will now be described in detail with reference to the drawings. Throughout the drawings, the same or similar elements, members and processes are denoted by the same reference numerals and explanation of which will not be repeated. The disclosed embodiments are provided for the purpose of illustration, not limitation, of the present disclosure and all features and combinations thereof described in the embodiments cannot be necessarily construed to describe the spirit of the present disclosure.

First Embodiment

A first embodiment of the present disclosure will now be described with reference to FIGS. 2 to 12.

Figure 2:
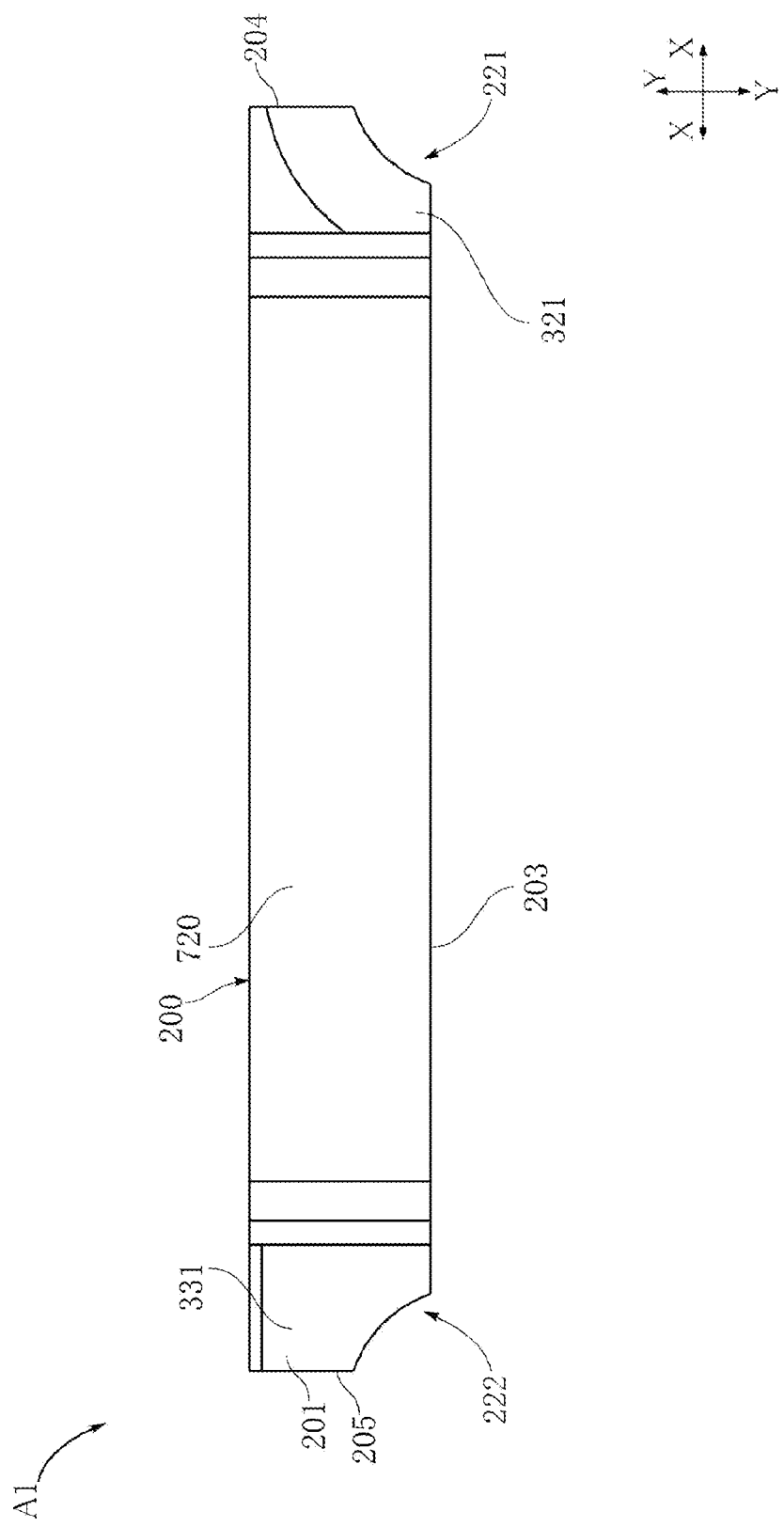
FIG. 2 is a plan view of an LED module according to a first embodiment of the present disclosure.
Figure 6:
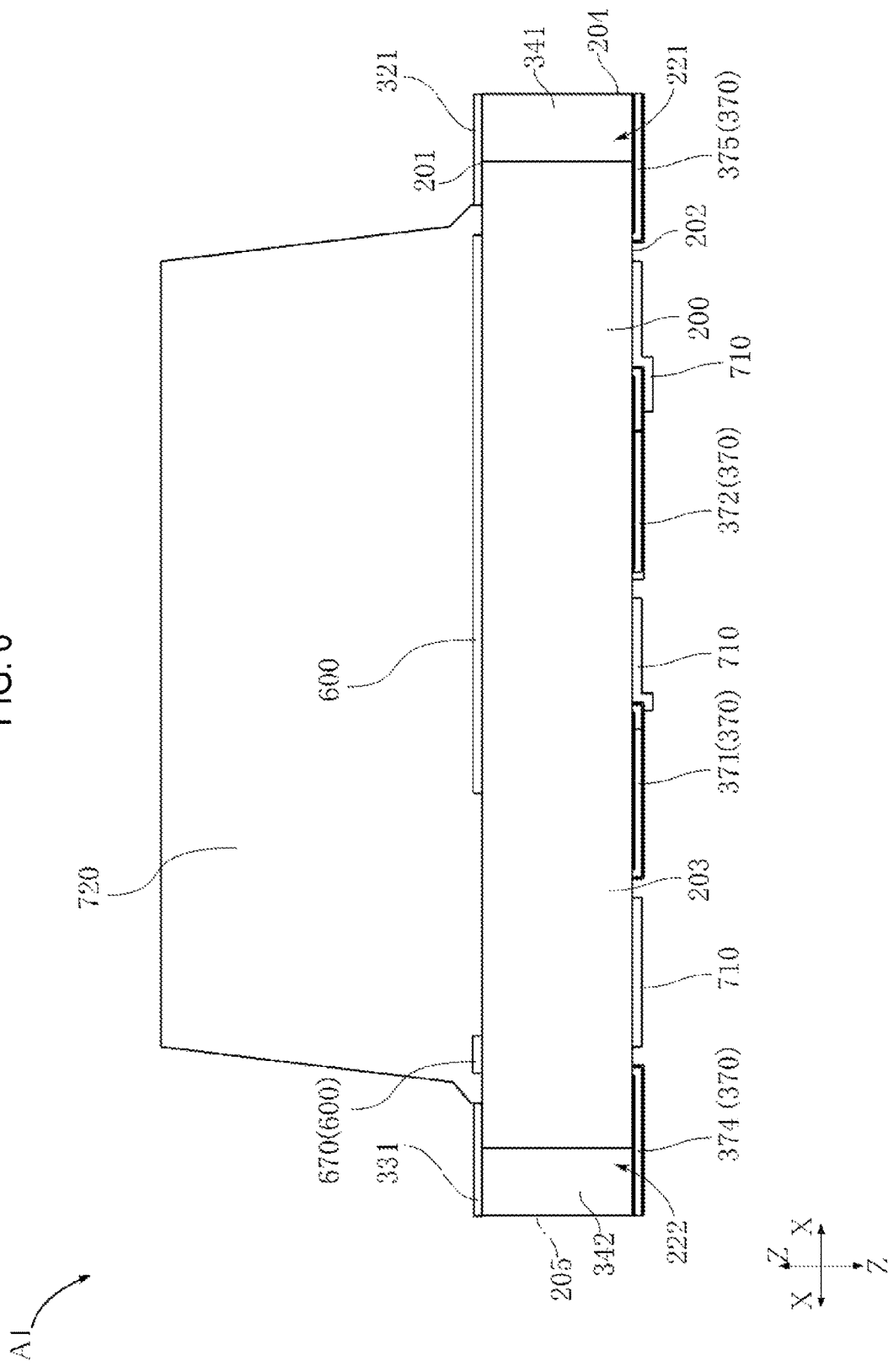
FIG. 6 is a front view of the LED module shown in FIG. 2.
Figure 7:
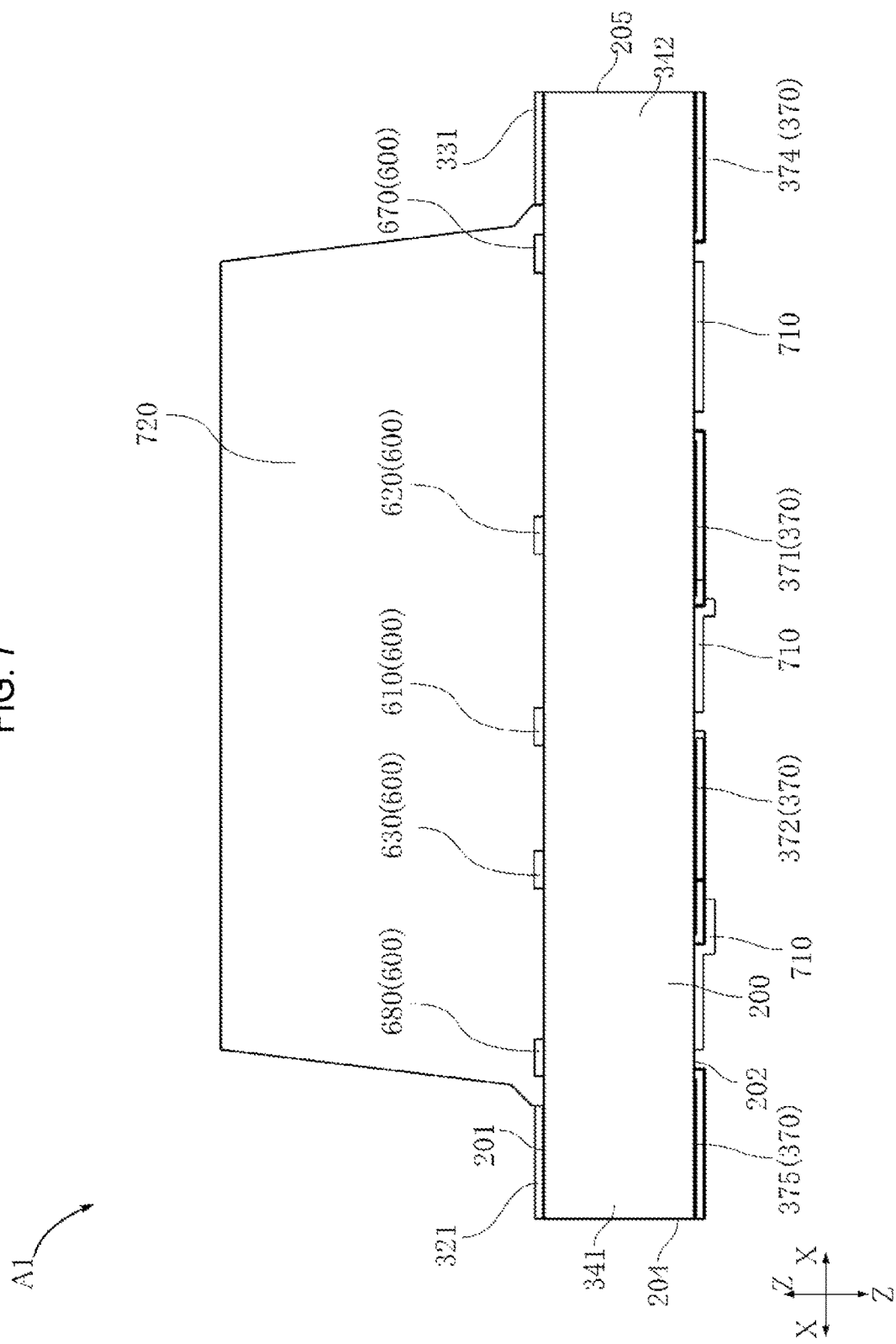
FIG. 7 is a view showing the LED module as viewed from the opposite side of FIG. 6.
Figure 8:
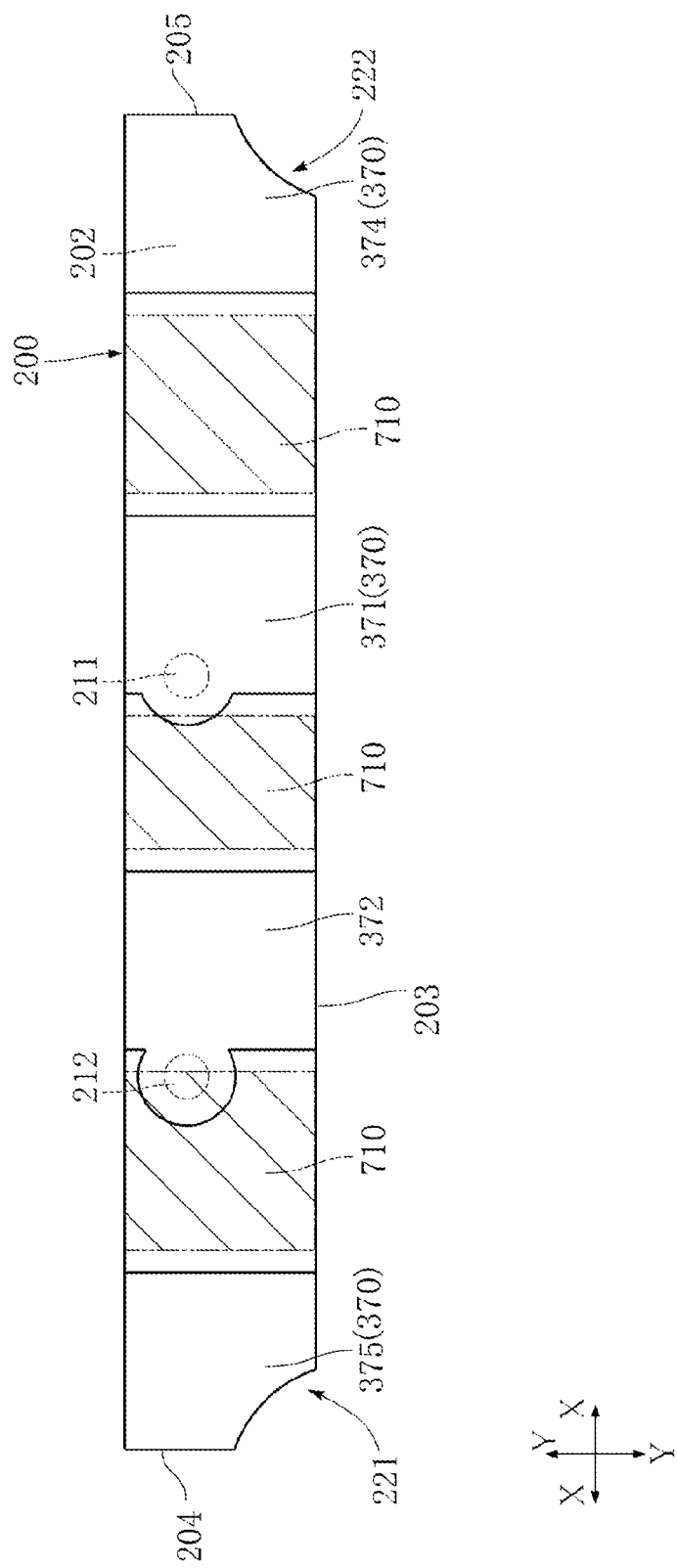
FIG. 8 is a view showing the LED module shown in FIG. 2 as viewed from a bottom.
Figure 9:
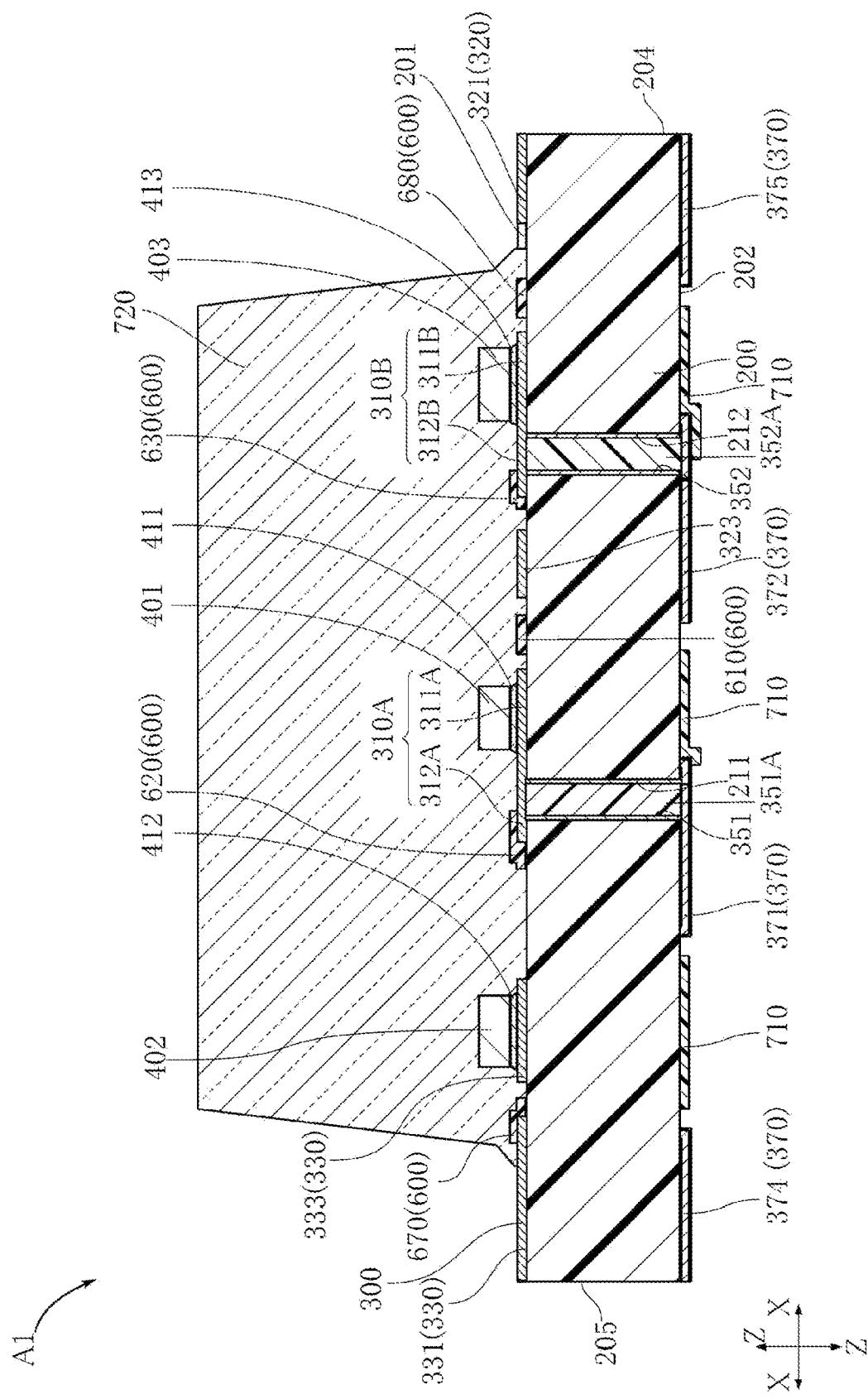
FIG. 9 is a sectional view taken along line IX-IX in FIG. 3.
Figure 10:
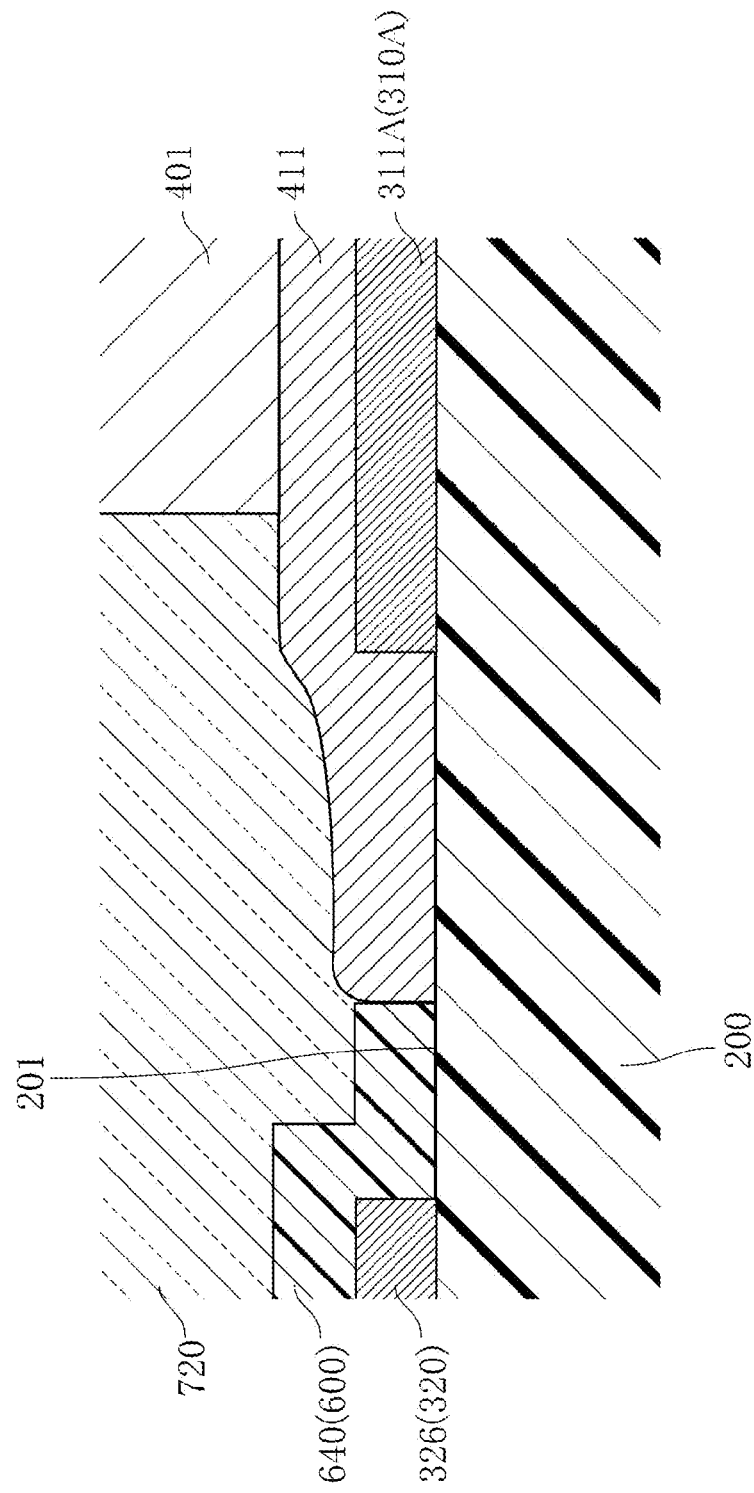
FIG. 10 is a partially-enlarged sectional view taken along line X-X in FIG. 3.
Figure 11:
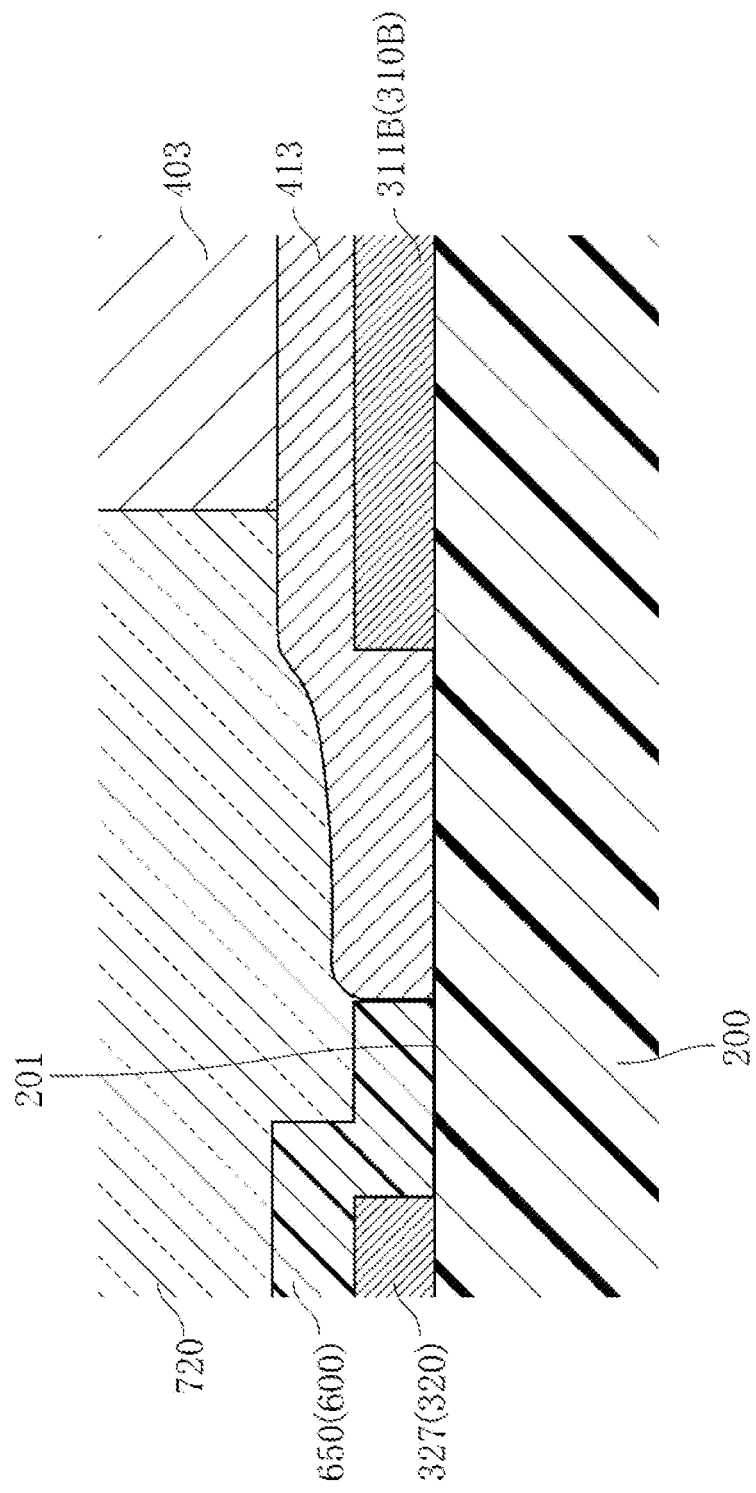
FIG. 11 is a partially-enlarged sectional view taken along line XI-XI in FIG. 3.

FIG. 2 is a plan view of an LED module according to the first embodiment of the present disclosure. FIG. 6 is a front view of the LED module shown in FIG. 2. FIG. 7 is a view showing the LED module as viewed from the opposite side of FIG. 6. FIG. 8 is a view showing the LED module shown in FIG. 2 as viewed from bottom. FIG. 9 is a sectional view taken along line IX-IX in FIG. 3.

An LED module A1 shown in FIGS. 2 to 11 includes a substrate 200, a conductive layer 300, a plurality of light emitting elements (first light emitting element 401, second light emitting element 402 and third light emitting element 403), a plurality of conductive boding layers (first conductive bonding layer 411, second conductive bonding layer 412 and third conductive bonding layer 413), a plurality of wires (first wire 501, second wire 502 and third wire 503), a main surface insulating film 600, a rear surface insulating film 710 and a transparent resin 720.

Figure 3:
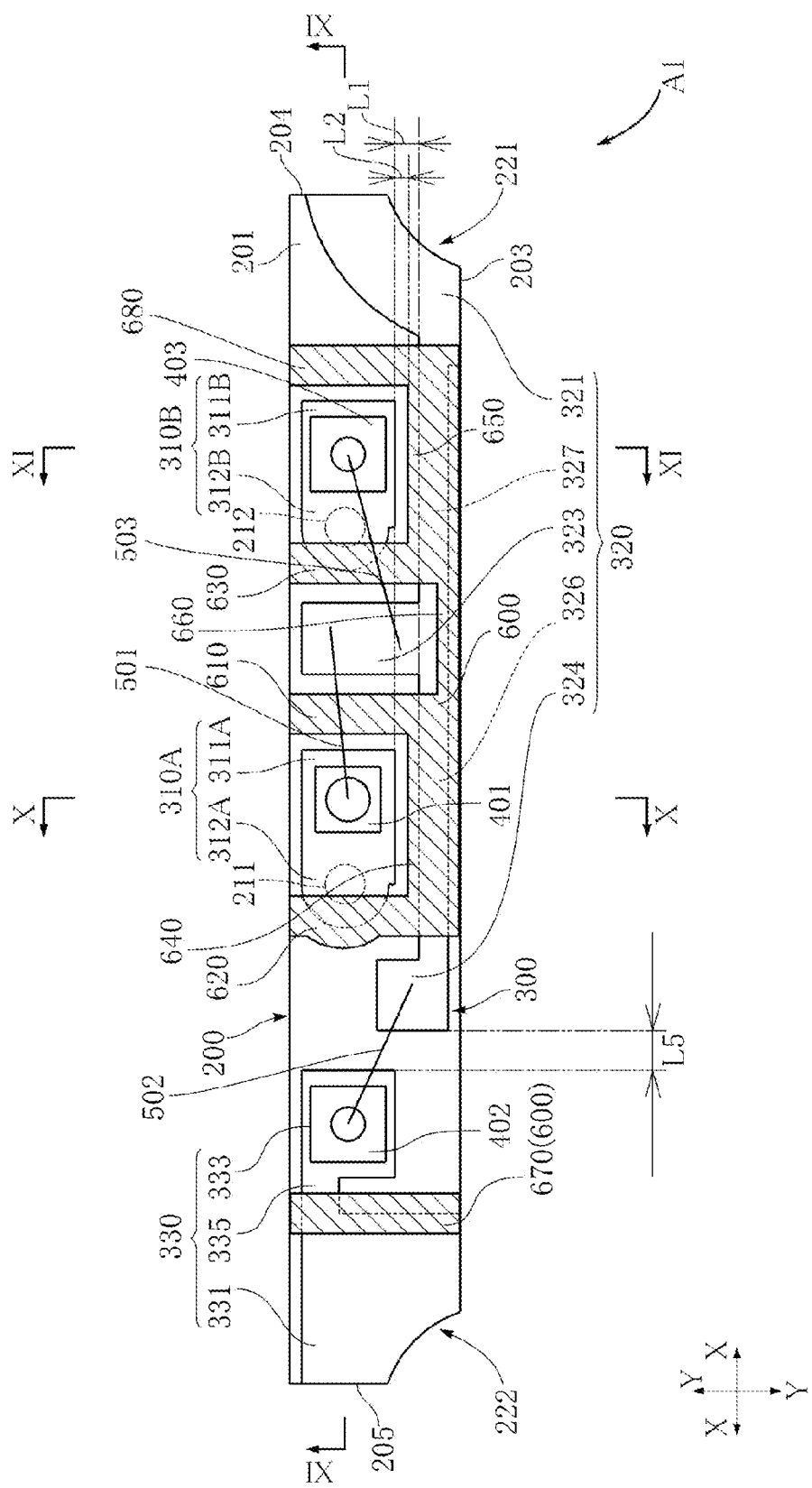
FIG. 3 is a view in which a transparent resin is excluded from FIG. 2.
Figure 4:
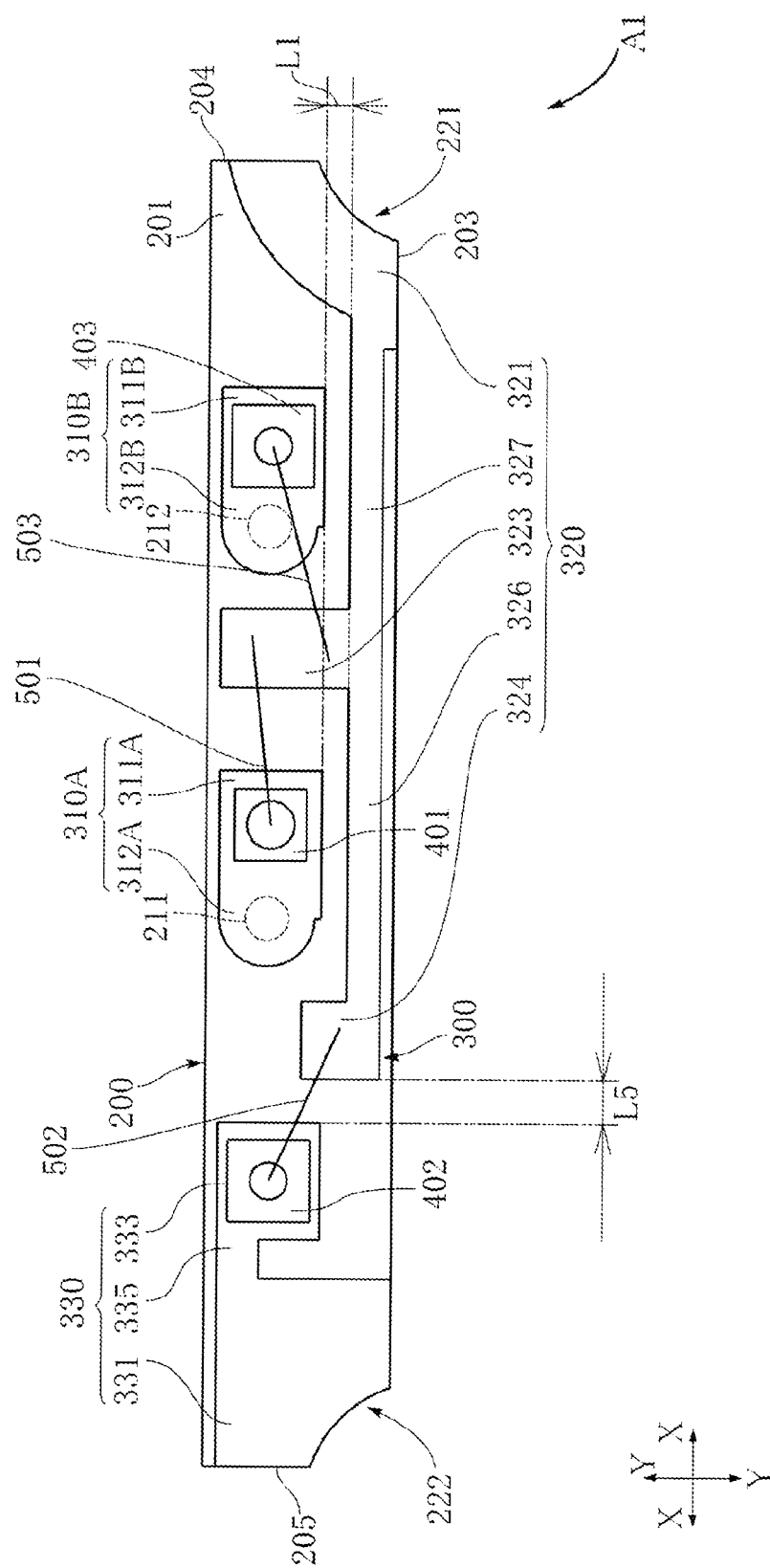
FIG. 4 is a view in which a main surface insulating film is excluded from FIG. 3.
Figure 5:
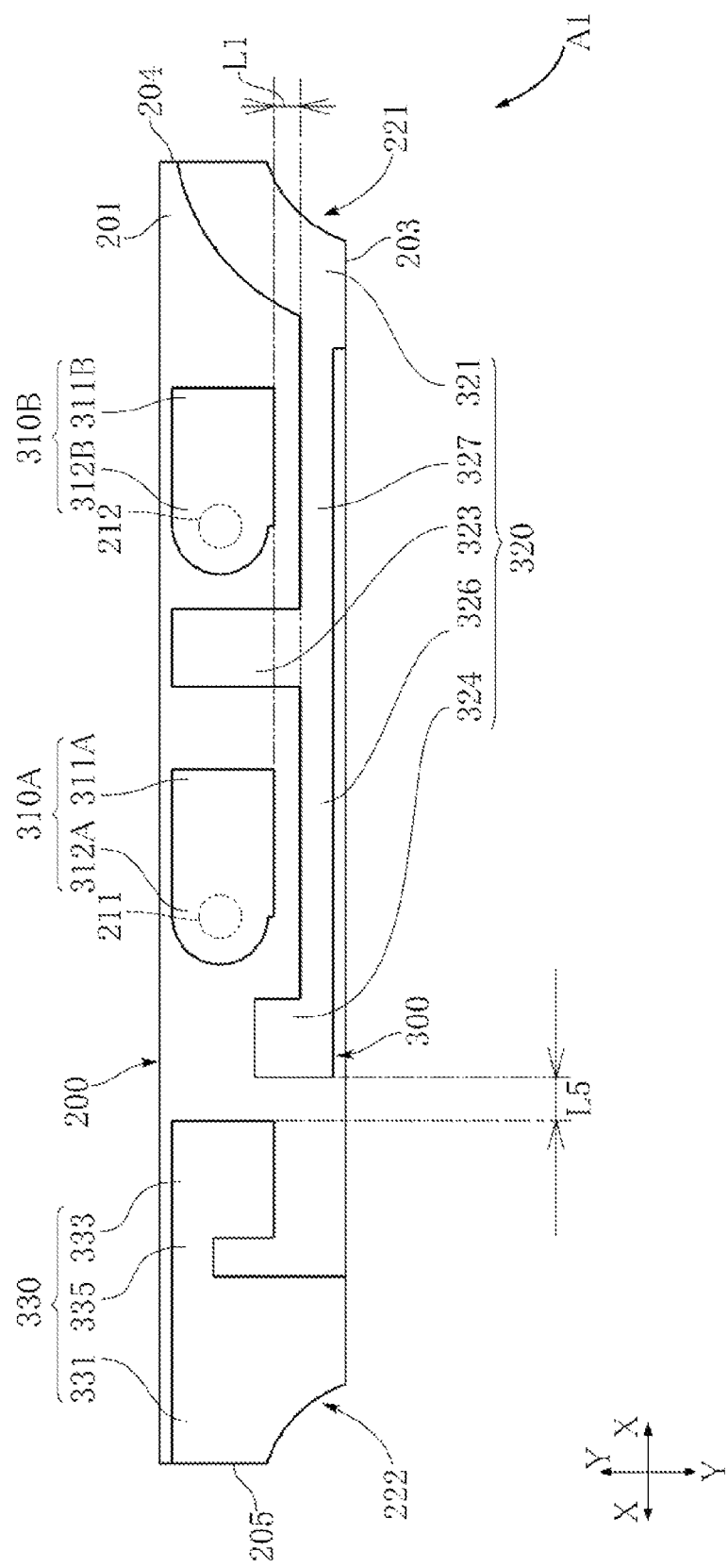
FIG. 5 is a view in which a light emitting element and a wire are excluded from FIG. 4.

FIG. 3 is a view in which the transparent resin is excluded from FIG. 2. FIG. 4 is a view in which the main surface insulating film is excluded from FIG. 3.

Figure 12:
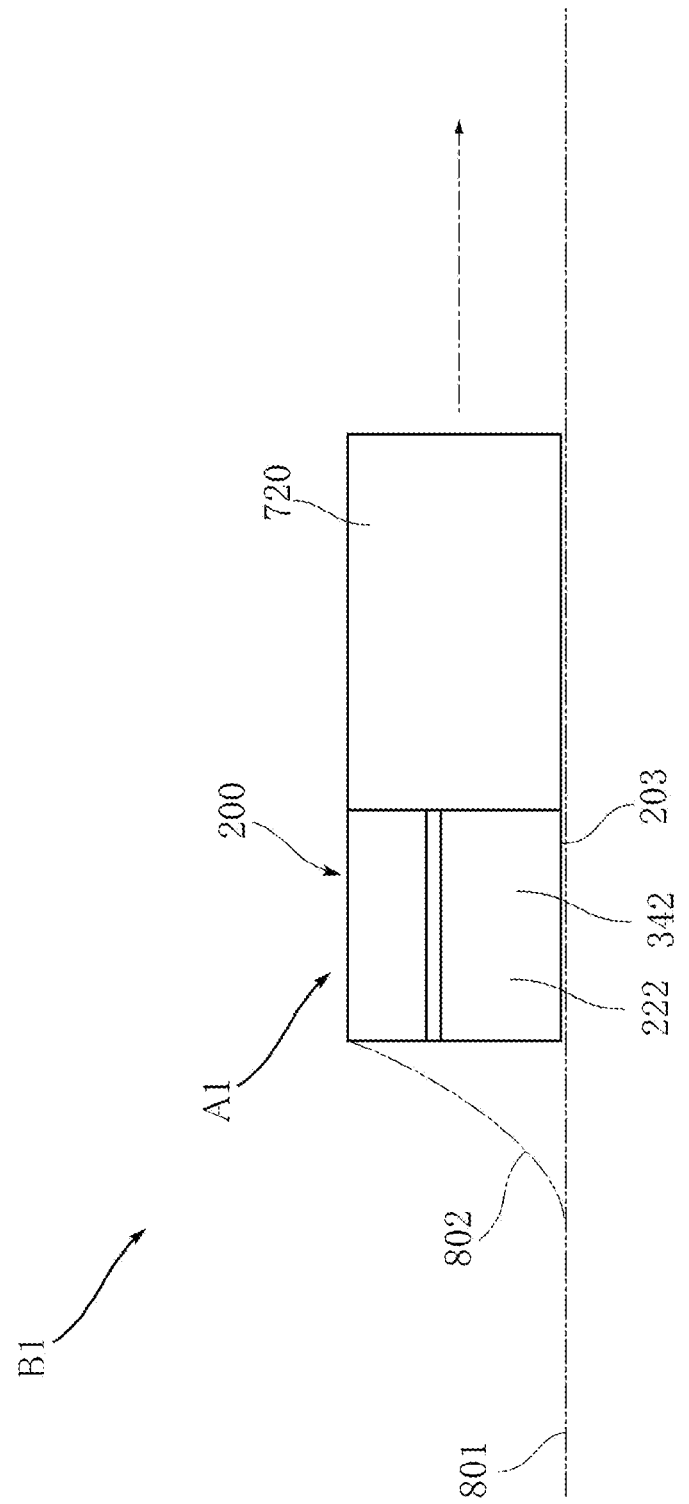
FIG. 12 is a view showing a packaging structure according to the first embodiment of the present disclosure.

The LED module A1 is a so-called side-view type LED module mounted on a circuit board 801, for example, with a posture shown in FIG. 12.

The substrate 200 is made of insulating material such as, for example, glass epoxy resin.

The substrate 200 has a main surface 201, a rear surface 202, a bottom surface 203 and side surfaces 204 and 205.

The main surface 201, the rear surface 202, the bottom surface 203 and the side surfaces 204 and 205 are all flat. The main surface 201 and the rear surface 202 are oriented in the opposite direction to each other and have an elongated rectangular shape. The thickness direction Z of the substrate 200 coincides with a direction perpendicular to the main surface 201. The bottom surface 203 connects with the long side of the main surface 201 and the long side of the rear surface 202 and also is a mounting surface. The side surfaces 204 and 205 respectively face directions opposite to each other. Each of the side surfaces 204 and 205 connects with the main surface 201 and the rear surface 202.

The substrate 200 is formed with two through holes, that is, a first through hole 211 and a second through hole 212, and two corner grooves 221 and 222.

The first through hole 211 and the second through hole 212 shown in FIGS. 3 to 5 and 9 are arranged at a side of the substrate 200 opposite to the bottom surface 203 in the lateral direction Y of the main surface 201. The first through hole 211 and the second through hole 212 extend from the main surface 201 to the rear surface 202 through the substrate 200 in the thickness direction Z.

The corner groove 221 is recessed from the side surface 204 and the bottom surface 203. The corner groove 221 reaches the main surface 201 and the rear surface 202 in the thickness direction Z of the substrate 200. The corner groove 222 is recessed from the side surface 205 and the bottom surface 203. The corner groove 222 reaches the main surface 201 and the rear surface 202 in the thickness direction Z of the substrate 200. The cross section of the corner grooves 221 and 222 are quadrant-shaped.

The conductive layer 300 forms a path for supplying power to the first light emitting element 401, the second light emitting element 402 and the third light emitting element 403. The conductive layer 300 is electrically coupled with the first light emitting element 401, the second light emitting element 402 and the third light emitting element 403.

As shown in FIGS. 3 and 4, the conductive layer 300 includes a first main surface individual electrode 310A, a second main surface individual electrode 310B, a first main surface common electrode 320, a main surface edge individual electrode 330, corner groove wirings 341 and 342, a first through wiring 351, a second through wiring 352 and a rear surface electrode 370. The conductive layer 300 has a stacked structure including, for example, a Cu plating, a Ni plating and an Au plating.

The first main surface individual electrode 310A is bonded with the first light emitting element 401. The first main surface individual electrode 310A includes a first die bonding portion 311A and a first adjacent portion 312A. The first die bonding portion 311A is bonded with the first light emitting element 401. In this embodiment, the first die bonding portion 311A has a rectangular shape. The first adjacent portion 312A is connected and adjacent to the first die bonding portion 311A. In this embodiment, the first adjacent portion 312A is located at the left side of the first die bonding portion 311A in FIGS. 3 to 5. The first adjacent portion 312A has the shape of a combination of a semi-circular portion and a rectangular portion.

The second main surface individual electrode 310B is bonded with the third light emitting element 403. The second main surface individual electrode 310B includes a second die bonding portion 311B and a second adjacent portion 312B. The second die bonding portion 311B is bonded with the third light emitting element 403. In this embodiment, the second die bonding portion 311B has a rectangular shape. The second adjacent portion 312B extends and is adjacent to the second die bonding portion 311B. In this embodiment, the second adjacent portion 312B is located at the left side of the second die bonding portion 311B in FIGS. 3 to 5. The second adjacent portion 312B has the shape of a combination of a semi-circular portion and a rectangular portion.

The main surface edge individual electrode 330 is located at an edge of the main surface 201 in the longitudinal direction X. The main surface edge individual electrode 330 is formed in the vicinity of a portion extending to the corner groove 222 of the main surface 201. The main surface edge individual electrode 330 is bonded with the second light emitting element 402.

The main surface edge individual electrode 330 includes a base 331, a die bonding portion 333 and a connecting portion 335.

The base 331 is located at the edge of the main surface 201 in the longitudinal direction X. The base 331 is formed in the vicinity of a portion extending to the corner groove 222 of the main surface 201. The die bonding portion 333 is bonded with the second light emitting element 402. In this embodiment, the die bonding portion 333 has a rectangular shape. The die bonding portion 333, the first die bonding portion 311A and the second die bonding portion 311B are arranged in the longitudinal direction X. The connecting portion 335 connects the base 331 and the die bonding portion 333. The connecting portion 335 extends to the base 331 and the die bonding portion 333. The connecting portion 335 has a strip shape extending in the longitudinal direction X.

The first main surface common electrode 320 is bonded with the first wire 501, the second wire 502 and the third wire 503. The first main surface common electrode 320 includes a base 321, a first wire bonding portion 323, a second wire bonding portion 324, a first strip portion 326 and a second strip portion 327.

The base 321 is located at the edge of the main surface 201 in the longitudinal direction X. The base 321 is formed in the vicinity of a portion extending to the corner groove 221 of the main surface 201. The base 321 has a quadrant annular shape.

The first wire bonding portion 323 is bonded with the first wire 501 and the third wire 503. In this embodiment, the first wire bonding portion 323 has a rectangular shape. The first wire bonding portion 323 is spaced apart from the first light emitting element 401 and the third light emitting element 403 in the longitudinal direction X. The first wire bonding portion 323 is located between the first light emitting element 401 and the third light emitting element 403 in the lateral direction Y. The first wire bonding portion 323 is located between the first die bonding portion 311A and the second die bonding portion 311B and is spaced apart from the first die bonding portion 311A and the second die bonding portion 311B.

The second wire bonding portion 324 is bonded with the second wire 502. In this embodiment, the second wire bonding portion 324 has a rectangular shape. The second wire bonding portion 324 is spaced apart from the first light emitting element 401 and the second light emitting element 402 in the longitudinal direction X. The second wire bonding portion 324 is located between the first light emitting element 401 and the second light emitting element 402 in the lateral direction Y. The second wire bonding portion 324 is located between the first die bonding portion 311A and the die bonding portion 333 in the longitudinal direction X and is spaced apart from the first die bonding portion 311A and the die bonding portion 333. A distance L5 between the second wire bonding portion 324 and the main surface edge individual electrode 330 (the die bonding portion 333) is, for example, 0.07 to 0.13 mm. The center of the second wire bonding portion 324 is located at a position spaced apart from the center of the first die bonding portion 311A and the center of the die bonding portion 333 in the lateral direction Y.

The first strip portion 326 is electrically coupled with the first wire bonding portion 323 and the second wire bonding portion 324. The first strip portion 326 extends to the first wire bonding portion 323 and the second wire bonding portion 324. The first strip portion 326 extends in the longitudinal direction X of the main surface 201. The first strip portion 326 is spaced apart from the first light emitting element 401 in the lateral direction Y of the main surface 201. The first strip portion 326 is spaced apart from the first main surface individual electrode 310A in the lateral direction Y of the main surface 201. A distance L1 between the first strip portion 326 and the first main surface individual electrode 310A is, for example, 0.04 to 0.08 mm.

The second strip portion 327 is electrically coupled with the first wire bonding portion 323 and the second wire bonding portion 324. The second strip portion 327 extends to the first wire bonding portion 323 and the base 321. The second strip portion 327 extends in the longitudinal direction X of the main surface 201. The second strip portion 327 is spaced apart from the third light emitting element 403 in the lateral direction Y of the main surface 201. The second strip portion 327 is spaced apart from the second main surface individual electrode 310B in the lateral direction Y of the main surface 201. A distance L1 between the second strip portion 327 and the second main surface individual electrode 310B is, for example, 0.04 to 0.08 mm.

The corner groove wirings 341 and 342 are formed to cover the inner surfaces of the corner grooves 221 and 222 of the substrate 200, respectively. The corner groove wirings 341 and 342 extend from the main surface 201 to the rear surface 202.

The first through wiring 351 shown in FIG. 9 penetrates through the substrate 200. The first through wiring 351 is formed in the inner surface of the first through hole 211 and has a cylindrical shape. The first through wiring 351 extends from the main surface 201 to the rear surface 202. The first through wiring 351 overlaps with the first adjacent portion 312A when viewed in the thickness direction Z. In this embodiment, the inside of the first through wiring 351 is filled with filling resin 351A.

The second through wiring 352 shown in FIG. 9 penetrates through the substrate 200. The second through wiring 352 is formed in the inner surface of the second through hole 212 and has a cylindrical shape. The second through wiring 352 extends from the main surface 201 to the rear surface 202. The second through wiring 352 overlaps with the second adjacent portion 312B when viewed in the thickness direction Z. In this embodiment, the inside of the second through wiring 352 is filled with filling resin 352A.

As shown in FIGS. 8 and 9, the rear surface electrode 370 is formed on the rear surface 202. In this embodiment, the rear surface electrode 370 includes individual electrodes 371 and 372, a rear surface edge individual electrode 374 and an edge common electrode 375.

The individual electrodes 371 and 372, the rear surface edge individual electrode 374 and the edge common electrode 375 are in parallel in the longitudinal direction X. The individual electrodes 371 and 372 are sandwiched between the rear surface edge individual electrode 374 and the edge common electrode 375. The individual electrode 371 overlaps with the first through hole 211 when viewed in the thickness direction Z and is accordingly connected to the first through wiring 351. The individual electrode 372 overlaps with the second through hole 212 when viewed in the thickness direction Z and is accordingly connected to the second through wiring 352. The rear surface edge individual electrode 374 is provided at one end of the rear surface 202 and is connected to the corner groove wiring 342. The edge common electrode 375 is provided at the other end of the rear surface 202 and is connected to the corner groove wiring 341.

The conductive layer 300 is not formed in the bottom surface 203 so that the bottom surface 203 is entirely exposed.

The main surface insulating film 600 shown in FIGS. 3 and 9 is formed on the main surface 201 and covers a portion of the conductive layer 300. The main surface insulating film 600 is indicated by hatching in FIG. 3. The main surface insulating film 600 is sometimes referred to as a resist layer. The main surface insulating film 600 includes a first insulating portion 610, a second insulating portion 620, a third insulating portion 630, a first covering portion 640, a second covering portion 650, a contact portion 660, a first insulating strip portion 670 and a second insulating strip portion 680.

The first insulating portion 610 includes a portion interposed between the first light emitting element 401 and the first wire bonding portion 323 when viewed in the thickness direction Z. The first insulating portion 610 crosses in front of a side of the first light emitting element 401 when viewed in the longitudinal direction X of the main surface 201. The first insulating portion 610 is formed to extend from one end of the main surface 201 in the lateral direction Y of the main surface 201 to the other end of the main surface 201 in the lateral direction Y of the main surface 201. The first insulating portion 610 has a strip shape extending in the lateral direction Y of the main surface 201. The first insulating portion 610 is spaced apart from the first wire bonding portion 323.

The second insulating portion 620 includes a portion interposed between the first light emitting element 401 and the second wire bonding portion 324 when viewed in the thickness direction Z of the substrate 200. The first light emitting element 401 is interposed between the second insulating portion 620 and the first insulating portion 610. The second insulating portion 620 crosses in front of a side of the first light emitting element 401 when viewed in the longitudinal direction X of the main surface 201. The second insulating portion 620 is formed to extend from one end of the main surface 201 in the lateral direction Y of the main surface 201 to the other end of the main surface 201 in the lateral direction Y of the main surface 201. The second insulating portion 620 has a strip shape extending in the lateral direction Y of the main surface 201. The second insulating portion 620 is spaced apart from the second wire bonding portion 324. The second insulating portion 620 overlaps with a portion of the first main surface individual electrode 310A. Specifically, the second insulating portion 620 overlaps with a portion of the first adjacent portion 312A.

The third insulating portion 630 includes a portion interposed between the third light emitting element 403 and the first wire bonding portion 323 when viewed in the thickness direction Z of the substrate 200. The first wire bonding portion 323 is interposed between the third insulating portion 630 and the first insulating portion 610. The third insulating portion 630 crosses in front of a side of the third light emitting element 403 when viewed in the longitudinal direction X of the main surface 201. The third insulating portion 630 is formed to extend from one end of the main surface 201 in the lateral direction Y of the main surface 201 to the other end of the main surface 201 in the lateral direction Y of the main surface 201. The third insulating portion 630 has a strip shape extending in the lateral direction Y of the main surface 201. The third insulating portion 630 is spaced apart from the first wire bonding portion 323. The third insulating portion 630 overlaps with a portion of the second main surface individual electrode 310B. Specifically, the third insulating portion 630 overlaps with a portion of the second adjacent portion 312B.

The first covering portion 640 covers the first strip portion 326. The first covering portion 640 has a strip shape extending in the longitudinal direction X of the main surface 201. The first covering portion 640 is wider than the first strip portion 326. Therefore, the first covering portion 640 extends to reach a side of the first strip portion 326 at which the first light emitting element 401 is positioned. The first covering portion 640 is connected to the first insulating portion 610 and the second insulating portion 620. The first covering portion 640 is spaced apart from the first main surface individual electrode 310A in the lateral direction Y of the main surface 201. A distance L2 between the first covering portion 640 and the first main surface individual electrode 310A is 0.02 to 0.06 mm, which is smaller than the distance L1.

The second covering portion 650 covers the second strip portion 327. The second covering portion 650 has a strip shape extending in the longitudinal direction X of the main surface 201. The second covering portion 650 is wider than the second strip portion 327. Therefore, the second covering portion 650 extends to reach a side of the second strip portion 327 at which the third light emitting element 403 is positioned. The second covering portion 650 is connected to the third insulating portion 630 and the second insulating strip portion 680. The second covering portion 650 is spaced apart from the second main surface individual electrode 310B in the lateral direction Y of the main surface 201. A distance L2 between the second covering portion 650 and the second main surface individual electrode 310B is 0.02 to 0.06 mm, which is smaller than the distance L1.

The contact portion 660 covers the first wire bonding portion 323. The contact portion 660 has a strip shape extending in the longitudinal direction X of the main surface 201. The contact portion 660 is connected to the third insulating portion 630 and the first insulating portion 610.

The first insulating strip portion 670 is formed near the edge of the main surface 201 in the longitudinal direction X. The second light emitting element 402 is interposed between the first insulating strip portion 670 and the second insulating portion 620. The first insulating strip portion 670 crosses in front of a side of the second light emitting element 402 when viewed in the longitudinal direction X of the main surface 201. The first insulating strip portion 670 is formed to extend from one end of the main surface 201 in the lateral direction Y of the main surface 201 to the other end of the main surface 201 in the lateral direction Y of the main surface 201. The first insulating strip portion 670 has a strip shape extending in the lateral direction Y of the main surface 201. The first insulating strip portion 670 overlaps with a portion of the main surface edge individual electrode 330. Specifically, the first insulating strip portion 670 overlaps with a portion of the base 331 and a part of the connecting portion 335. The first insulating strip portion 670 is provided to prevent a solder 802 (which will be described later) from infiltrating between the main surface 201 and the transparent resin 720 in forming the solder 802.

The second insulating strip portion 680 is formed near the edge of the main surface 201 in the longitudinal direction X. The third light emitting element 403 is interposed between the second insulating strip portion 680 and the third insulating portion 630. The second insulating strip portion 680 crosses in front of a side of the third light emitting element 403 when viewed in the longitudinal direction X of the main surface 201. The second insulating strip portion 680 is formed to extend from one end of the main surface 201 in the lateral direction Y of the main surface 201 to the other end of the main surface 201 in the lateral direction Y of the main surface 201. The second insulating strip portion 680 has a strip shape extending in the lateral direction Y of the main surface 201. The second insulating strip portion 680 overlaps with a portion of the first main surface common electrode 320. Specifically, the second insulating strip portion 680 overlaps with a portion of the base 331 and a part of the second strip portion 327. The second insulating strip portion 680 is provided to prevent the solder 802 (which will be described later) from infiltrating between the main surface 201 and the transparent resin 720 in forming the solder 802.

The rear surface insulating film 710 shown in FIGS. 8 and 9 is formed on the rear surface 202 and covers a portion of the conductive layer 300. The rear surface insulating film 710 is shown with a virtual line (two-dot chain line) and is indicated by hatching in FIG. 8. The rear surface insulating film 710 is sometimes referred to as a resist layer. The rear surface insulating film 710 covers a portion of the rear surface, which is exposed from the rear surface electrode 370, and portions of the individual electrodes 371 and 372.

The first light emitting element 401, the second light emitting element 402 and the third light emitting element 403 serves as light sources of the LED module A1 and are arranged on the main surface 201. Each of the first light emitting element 401, the second light emitting element 402 and the third light emitting element 403 has a stacked structure including, for example, a p type semiconductor layer, an n type semiconductor layer and an active layer sandwiched therebetween.

The first light emitting element 401 emits, for example, red light. At least three sides of the first light emitting element 401 are surrounded by the first insulating portion 610, the second insulating portion 620 and the first covering portion 640 of the main surface insulating film 600. The second light emitting element 402 emits, for example, green light. The third light emitting element 403 emits, for example, blue light. At least three sides of the third light emitting element 403 are surrounded by the third insulating portion 630, the second insulating strip portion 680 and the second covering portion 650 of the main surface insulating film 600.

The first conductive bonding layer 411 shown in FIG. 9 is interposed between the first light emitting element 401 and the conductive layer 300. The first conductive bonding layer 411 is derived from, for example, silver paste. If a fluid (for example, silver paste) infiltrates between the first main surface individual electrode 310A and the first strip portion 326 before the first conductive bonding layer 411 is cured, the first conductive bonding layer 411 may also be formed in a gap between the first main surface individual electrode 310A and the first strip portion 326 (see FIG. 10). In addition, the first conductive bonding layer 411 may contact with the first insulating portion 610, the second insulating portion 620 and the first covering portion 640.

The second conductive bonding layer 412 is interposed between the second light emitting element 402 and the conductive layer 300. The second conductive bonding layer 412 is derived from, for example, silver paste.

The third conductive bonding layer 413 is interposed between the third light emitting element 403 and the conductive layer 300. The third conductive bonding layer 413 is derived from, for example, silver paste. If a fluid (for example, silver paste) infiltrates between the second main surface individual electrode 310B and the second strip portion 327 before the third conductive bonding layer 413 is cured, the third conductive bonding layer 413 may also be formed in a gap between the second main surface individual electrode 310B and the second strip portion 327 (see FIG. 11). In addition, the third conductive bonding layer 413 may contact with the third insulating portion 630, the second insulating strip portion 680 and the second covering portion 650.

The first wire 501 shown in FIGS. 3 and 4 is bonded to the first light emitting element 401 and the first wire bonding portion 323. The first wire 501 crosses the first insulating portion 610. The second wire 502 is bonded to the second light emitting element 402 and the second wire bonding portion 324. The third wire 503 is bonded to the third light emitting element 403 and the first wire bonding portion 323. The third wire 503 crosses the third insulating portion 630.

The transparent resin 720 is formed on the main surface 201 of the substrate 200 and covers the first light emitting element 401, the second light emitting element 402 and the third light emitting element 403. The transparent resin 720 is a transparent resin such as an epoxy resin or the like. The transparent resin 720 is a resin through which light from the first light emitting element 401, the second light emitting element 402 and the third light emitting element 403 can transmit. In this embodiment, the transparent resin 720 has a trapezoidal shape when viewed in the lateral direction Y and a rectangular shape when viewed in the longitudinal direction X.

As shown in FIG. 12, the LED module A1 is mounted on the circuit board 801 via the solder 802. The LED module A1, the circuit board 801 and the solder 802 form an LED module packaging structure B1. As described above, since the bottom surface 203 serves as a mount surface, the bottom surface 203 faces the circuit board 801 in the packaging structure B1. The solder 802 contacts with the individual electrodes 371 and 372 and an electrode pad (not shown) of the circuit board 801. In addition, the solder 802 contacts with the rear surface edge individual electrode 374, the edge common electrode 375 and the electrode pad (not shown) of the circuit board 801. The corner grooves 221 and 222 are filled with some of the solder 802.

Next, the operation and effects of this embodiment will be described.

In this embodiment, the main surface insulating film 600 includes the first insulating portion 610. The first insulating portion 610 has a portion interposed between the first light emitting element 401 and the first wire bonding portion 323 when viewed in the thickness direction Z of the substrate 200 which is perpendicular to the main surface 201. With this configuration, even when a fluid (for example, silver paste) infiltrates between the first main surface individual electrode 310A and the first strip portion 326 before the first conductive bonding layer 411 is cured, it is possible to prevent the fluid from reaching the first wire bonding portion 323. This can prevent the first conductive bonding layer 411 from contacting the first wire bonding portion 323. As a result, it is possible to avoid short-circuit of the first conductive bonding layer 411 and the first wire bonding portion 323, which is suitable for increasing a yield of the LED module A1.

In this embodiment, the distance L1 between the first strip portion 326 and the first main surface individual electrode 310A is very small, for example, 0.04 to 0.08 mm. With this configuration, if a fluid (for example, silver paste) infiltrates between the first main surface individual electrode 310A and the first strip portion 326 before the first conductive bonding layer 411 is cured, the fluid is likely to flow toward the first wire bonding portion 323 due to a capillary effect (or a similar effect). Therefore, the configuration of this embodiment which is capable of preventing the first conductive bonding layer 411 from contacting the first wire bonding portion 323 is very suitable for avoiding short-circuit of the first conductive bonding layer 411 and the first wire bonding portion 323.

In this embodiment, the main surface insulating film 600 includes the first covering portion 640 covering the first strip portion 326. The first covering portion 640 extends to reach a side of the first strip portion 326 at which the first light emitting element 401 is positioned. With this configuration, it is possible to prevent the first conductive bonding layer 411 from contacting the first strip portion 326. As a result, it is possible to avoid short-circuit of the first conductive bonding layer 411 and the first strip portion 326, which is suitable for increasing a yield of the LED module A1.

In this embodiment, the main surface insulating film 600 includes the second insulating portion 620. The second insulating portion 620 has a portion interposed between the first light emitting element 401 and the second wire bonding portion 324 when viewed in the thickness direction Z of the substrate 200. The first light emitting element 401 is interposed between the second insulating portion 620 and the first insulating portion 610. With this configuration, even when a fluid (for example, silver paste) infiltrates between the first main surface individual electrode 310A and the first strip portion 326 before the first conductive bonding layer 411 is cured, it is possible to prevent the fluid from reaching the second wire bonding portion 324. This can prevent the first conductive bonding layer 411 from contacting the second wire bonding portion 324. As a result, it is possible to avoid short-circuit of the first conductive bonding layer 411 and the second wire bonding portion 324, which is suitable for increasing a yield of the LED module A1.

In this embodiment, the first light emitting element 401 and the second light emitting element 402 are spaced apart from each other in the longitudinal direction X of the main surface 201. The second wire bonding portion 324 is interposed between the first light emitting element 401 and the second light emitting element 402 when viewed in the lateral direction Y of the main surface 201. This configuration eliminates a need to provide the first strip portion 326 connecting the first wire bonding portion 323 and the second wire bonding portion 324 at a position overlapping with the second light emitting element 402 in the longitudinal direction X. Therefore, it is possible to prevent a fluid (for example, silver paste) from reaching the second wire bonding portion 324 through the first strip portion 326 before the second conductive bonding layer 412 is cured. This can prevent the second conductive bonding layer 412 from contacting the second wire bonding portion 324. As a result, it is possible to avoid short-circuit of the second conductive bonding layer 412 and the second wire bonding portion 324, which is suitable for increasing a yield of the LED module A1.

In this embodiment, the distance L5 between the second wire bonding portion 324 and the main surface edge individual electrode 330 (the die bonding portion 333) is relatively large, for example, 0.07 to 0.13 mm. The distance L5 is a dimension suitable for preventing a fluid (for example, silver paste) from reaching the second wire bonding portion 324 before the second conductive bonding layer 412 is cured.

In this embodiment, the main surface insulating film 600 includes the third insulating portion 630. The third insulating portion 630 has a portion interposed between the third light emitting element 403 and the first wire bonding portion 323 when viewed in the thickness direction Z of the substrate 200 which is perpendicular to the main surface 201. With this configuration, even when a fluid (for example, silver paste) infiltrates between the second main surface individual electrode 310B and the second strip portion 327 before the third conductive bonding layer 413 is cured, it is possible to prevent the fluid from reaching the first wire bonding portion 323. This can prevent the third conductive bonding layer 413 from contacting the first wire bonding portion 323. As a result, it is possible to avoid short-circuit of the third conductive bonding layer 413 and the first wire bonding portion 323, which is suitable for increasing a yield of the LED module A1.

In this embodiment, the distance L1 between the second strip portion 327 and the second main surface individual electrode 310B is very small, for example, 0.04 to 0.08 mm. With this configuration, if a fluid (for example, silver paste) infiltrates between the second main surface individual electrode 310B and the second strip portion 327 before the third conductive bonding layer 413 is cured, the fluid is likely to flow toward the first wire bonding portion 323 due to a capillary effect. Therefore, the configuration of this embodiment which is capable of preventing the third conductive bonding layer 413 from contacting the first wire bonding portion 323 is very suitable for avoiding short-circuit of the third conductive bonding layer 413 and the first wire bonding portion 323.

In this embodiment, the main surface insulating film 600 includes the second covering portion 650 covering the second strip portion 327. The second covering portion 650 extends to reach a side of the second strip portion 327 at which the third light emitting element 403 is positioned. With this configuration, it is possible to prevent the third conductive bonding layer 413 from contacting the second strip portion 327. As a result, it is possible to avoid short-circuit of the third conductive bonding layer 413 and the second strip portion 327, which is suitable for increasing a yield of the LED module A1.

In this embodiment, the main surface insulating film 600 includes the second insulating strip portion 680. The second insulating strip portion 680 has a portion interposed between the third light emitting element 403 and the base 321 when viewed in the thickness direction Z of the substrate 200. The third light emitting element 403 is interposed between the second insulating strip portion 680 and the third insulating portion 630. With this configuration, even when a fluid (for example, silver paste) infiltrates between the second main surface individual electrode 310B and the second strip portion 327 before the third conductive bonding layer 413 is cured, it is possible to prevent the fluid from reaching the base 321. This can prevent the third conductive bonding layer 413 from contacting the base 321. As a result, it is possible to avoid short-circuit of the third conductive bonding layer 413 and the base 321, which is suitable for increasing a yield of the LED module A1.

It has been illustrated in the above embodiment that the main surface 600 includes all of the first insulating portion 610, the second insulating portion 620 and the third insulating portion 630. However, the present disclosure is not limited thereto. For example, the main surface 600 may not include the second insulating portion 620 and the third insulating portion 630.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An LED module comprising:
a substrate including a main surface, a rear surface and a bottom surface;
a first light emitting element disposed on the main surface;
a conductive layer formed on the substrate and electrically coupled with the first light emitting element;
a first conductive bonding layer interposed between the first light emitting element and the conductive layer;
a main surface insulating film formed on the main surface and covering a portion of the conductive layer; and
a first wire,
wherein the main surface and the rear surface respectively face directions opposite to each other and have an elongated rectangular shape, and the bottom surface connects a long side of the main surface with a long side of the rear surface and is a mounting surface,
wherein the conductive layer includes a first wire bonding portion to which the first wire is bonded,
wherein the main surface insulating film includes a first insulating portion, and the first insulating portion includes a portion interposed between the first light emitting element and the first wire bonding portion when viewed in a thickness direction of the substrate perpendicular to the main surface,
wherein the conductive layer includes a first strip portion extending in the longitudinal direction of the main surface and electrically coupled with the first wire bonding portion, and
wherein the first strip portion is spaced apart from the first light emitting element in the lateral direction of the main surface.

2. The LED module of claim 1, wherein the first insulating portion crosses in front of a side of the first light emitting element when viewed in the longitudinal direction of the main surface.

3. LED module of claim 1, wherein the first insulating portion is formed to extend from one end of the main surface in the lateral direction of the main surface to the other end of the main surface in the lateral direction of the main surface.

4. The LED module of claim 1, wherein the first insulating portion is of a strip shape extending in the lateral direction of the main surface.

5. The LED module of claim 1, wherein the first insulating portion is spaced apart from the first wire bonding portion.

6. The LED module of claim 1, wherein the first wire bonding portion is spaced apart from the first light emitting element in the longitudinal direction of the main surface.

7. The LED module of claim 1, wherein the first wire is bonded to the first light emitting element.

8. The LED module of claim 1, wherein the first wire crosses the first insulating portion.

9. The LED module of claim 1, wherein the first strip portion is connected to the first wire bonding portion.

10. The LED module of claim 1, wherein the conductive layer includes a first main surface individual electrode to which the first light emitting element is bonded, and
wherein the first strip portion is spaced apart from the first main surface individual electrode in the lateral direction of the main surface.

11. The LED module of claim 10, wherein a distance between the first strip portion and the first main surface individual electrode is 0.04 to 0.08 mm.

12. The LED module of claim 1, wherein the main surface insulating film includes a first covering portion covering the first strip portion, and
wherein the first covering portion extends to reach a side of the first strip portion at which the first light emitting element is positioned.

13. The LED module of claim 12, wherein the first covering portion is of a strip shape extending in the longitudinal direction of the main surface.

14. The LED module of claim 13, wherein the first covering portion is wider than the first strip portion.

15. The LED module of claim 12, wherein the first covering portion is connected to the first insulating portion.

16. The LED module of claim 12, wherein the conductive layer includes a first main surface individual electrode to which the first light emitting element is bonded,
wherein the first covering portion is spaced apart from the first main surface individual electrode in the lateral direction of the main surface, and
wherein a distance between the first covering portion and the first main surface individual electrode is 0.02 to 0.06 mm.

17. The LED module of claim 12, further comprising a second wire,
wherein the conductive layer includes a second wire bonding portion to which the second wire is bonded,
wherein the main surface insulating film includes a second insulating portion and the second insulating portion includes a portion interposed between the first light emitting element and the second wire bonding portion when viewed in the thickness direction of the substrate, and
wherein the first light emitting element is interposed between the second insulating portion and the first insulating portion.

18. The LED module of claim 17, wherein the second insulating portion crosses in front of a side of the first light emitting element when viewed in the longitudinal direction of the main surface.

19. The LED module of claim 17, wherein the second insulating portion is formed to extend from one end of the main surface in the lateral direction of the main surface to the other end of the main surface in the lateral direction of the main surface.

20. The LED module of claim 17, wherein the second insulating portion is of a strip shape extending in the lateral direction of the main surface.

21. The LED module of claim 17, wherein the second insulating portion is spaced apart from the second wire bonding portion.

22. The LED module of claim 17, wherein the second wire bonding portion is spaced apart from the first light emitting element in the longitudinal direction of the main surface.

23. The LED module of claim 17, wherein the second wire bonding portion is electrically coupled with the first wire bonding portion.

24. The LED module of claim 17, wherein the second wire bonding portion is connected to the first strip portion.

25. The LED module of claim 17, wherein the second insulating portion is connected to the first covering portion.

26. The LED module of claim 25, wherein at least three sides of the first light emitting element are surrounded by the first insulating portion, the second insulating portion and the first covering portion of the main surface insulating film.

27. The LED module of claim 17, wherein the conductive layer includes a first main surface individual electrode to which the first light emitting element is bonded,
wherein the conductive layer includes a first through wiring penetrating through the substrate,
wherein the first main surface individual electrode includes a first die bonding portion to which the first light emitting element is bonded, and a first adjacent portion connected to the first die bonding portion and adjacent to the first die bonding portion, and
wherein the first adjacent portion overlaps with the first through wiring when viewed in the thickness direction.

28. The LED module of claim 27, wherein the second insulating portion overlaps with the first adjacent portion when viewed in the thickness direction.

29. The LED module of claim 17, further comprising:
a second light emitting element disposed on the main surface; and
a second conductive bonding layer interposed between the second light emitting element and the conductive layer,
wherein the first light emitting element and the second light emitting element are spaced apart from each other in the longitudinal direction of the main surface, and
wherein the second wire bonding portion is interposed between the first light emitting element and the second light emitting element when viewed in the lateral direction of the main surface.

30. The LED module of claim 29, wherein the second wire is bonded to the second light emitting element.

31. The LED module of claim 29, wherein the conductive layer includes a main surface edge individual electrode to which the second light emitting element is bonded, and
wherein a distance between the main surface edge individual electrode and the second wire bonding portion is 0.07 to 0.13 mm.

32. The LED module of claim 29, further comprising:
a third light emitting element disposed on the main surface; and
a third conductive bonding layer interposed between the third light emitting element and the conductive layer,
wherein the first light emitting element is interposed between the second light emitting element and the third light emitting element when viewed in the lateral direction of the main surface, and
wherein the main surface insulating film includes a third insulating portion and the third insulating portion has a portion interposed between the third light emitting element and the first wire bonding portion when viewed in the thickness direction of the substrate.

33. The LED module of claim 32, wherein the conductive layer includes a second main surface individual electrode to which the third light emitting element is bonded, and wherein the third insulating portion covers a portion of the second main surface individual electrode.

34. The LED module of claim 33, wherein the conductive layer includes a second through wiring penetrating through the substrate,
wherein the second main surface individual electrode includes a second die bonding portion to which the third light emitting element is bonded, and a second adjacent portion which is connected to the second die bonding portion and is adjacent to the second die bonding portion, and
wherein the second adjacent portion overlaps with the second through wiring when viewed in the thickness direction.

35. The LED module of claim 34, wherein the third insulating portion overlaps with the second adjacent portion when viewed in the thickness direction.

36. The LED module of claim 32, wherein the conductive layer includes a second strip portion electrically coupled with the first wire bonding portion and extends in the lateral direction of the main surface, and
wherein the second strip portion is spaced apart from the third light emitting element in the lateral direction of the main surface.

37. The LED module of claim 36, wherein the second strip portion is connected to the first wire bonding portion.

38. The LED module of claim 36, wherein the main surface insulating film includes a second covering portion covering the second strip portion, and
wherein the second covering portion extends to reach a side of the second strip portion at which the third light emitting element is positioned.

39. The LED module of claim 38, wherein the second covering portion is of a strip shape extending in the longitudinal direction of the main surface.

40. The LED module of claim 39, wherein the second covering portion is wider than the second strip portion.

41. The LED module of claim 38, wherein the second covering portion is connected to the third insulating portion.

42. The LED module of claim 1, wherein the substrate has a side surface connecting the main surface and the rear surface,
wherein the substrate is formed with a corner groove, the corner groove recessed from the side surface and the bottom surface and extending to the main surface and the rear surface in the thickness direction of the substrate, and
wherein the conductive layer includes a corner groove wiring formed in an inner surface of the corner groove.

43. The LED module of claim 42, wherein the corner groove has a quadrant-shaped cross section.

44. The LED module of claim 1, wherein the conductive layer further includes a rear surface electrode formed on the rear surface.

45. The LED module of claim 1, further comprising a transparent resin covering the first light emitting element.

46. An LED module packaging structure comprising:
the LED module of claim 1; and
a circuit board facing the bottom surface.

* * * * *